(12) United States Patent
Koskela et al.

(10) Patent No.: US 12,267,062 B2
(45) Date of Patent: Apr. 1, 2025

(54) TRANSVERSELY-EXCITED FILM BULK ACOUSTIC RESONATORS WITH THREE-LAYER ELECTRODES

(71) Applicant: Murata Manufacturing Co., Ltd., Nagaokakyo (JP)

(72) Inventors: Julius Koskela, Helsinki (FI); Bryant Garcia, Burlingame, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 869 days.

(21) Appl. No.: 17/108,809

(22) Filed: Dec. 1, 2020

(65) Prior Publication Data

US 2021/0399714 A1    Dec. 23, 2021

Related U.S. Application Data

(60) Provisional application No. 63/043,672, filed on Jun. 24, 2020, provisional application No. 63/040,437, filed on Jun. 17, 2020.

(51) Int. Cl.
*H03H 9/13* (2006.01)
*H03H 9/02* (2006.01)
(Continued)

(52) U.S. Cl.
CPC ........ *H03H 9/131* (2013.01); *H03H 9/02228* (2013.01); *H03H 9/174* (2013.01);
(Continued)

(58) Field of Classification Search
CPC ...... H03H 9/131; H03H 9/0228; H03H 9/174; H03H 9/564; H03H 9/568
See application file for complete search history.

(56) References Cited

U.S. PATENT DOCUMENTS

| 5,446,330 A | 8/1995 | Eda et al. |
|---|---|---|
| 5,552,655 A | 9/1996 | Stokes et al. |

(Continued)

FOREIGN PATENT DOCUMENTS

| CN | 110308579 A | 10/2019 |
|---|---|---|
| WO | 2016017104 | 2/2016 |

(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Samuel S Outten
(74) *Attorney, Agent, or Firm* — ArentFox Schiff LLP

(57) ABSTRACT

There is disclosed acoustic resonators and filter devices. An acoustic resonator includes a substrate having a surface and a single-crystal piezoelectric plate having front and back surfaces, the back surface attached to the surface of the substrate except for a portion of the piezoelectric plate forming a diaphragm that spans a cavity in the substrate. An interdigital transducer (IDT) is formed on the front surface of the single-crystal piezoelectric plate such that interleaved fingers of the IDT are disposed on the diaphragm. The piezoelectric plate and the IDT are configured such that a radio frequency signal applied to the IDT excites a primary shear acoustic mode in the diaphragm. The interleaved fingers comprise a first layer proximate the diaphragm, a second layer over the first layer, and a third layer over the second layer, wherein adjacent layers are different materials.

28 Claims, 7 Drawing Sheets

(51) Int. Cl.
  *H03H 9/17* (2006.01)
  *H03H 9/56* (2006.01)
  *H03H 3/02* (2006.01)

(52) U.S. Cl.
  CPC ............ *H03H 9/564* (2013.01); *H03H 9/568* (2013.01); *H03H 2003/023* (2013.01)

(56) References Cited

U.S. PATENT DOCUMENTS

| | | |
|---|---|---|
| 5,726,610 A | 3/1998 | Allen et al. |
| 5,853,601 A | 12/1998 | Krishaswamy |
| 6,211,936 B1 | 4/2001 | Nakamura |
| 6,377,140 B1 | 4/2002 | Ehara et al. |
| 6,516,503 B1 | 2/2003 | Ikada et al. |
| 6,540,827 B1 | 4/2003 | Levy et al. |
| 6,707,229 B1 | 3/2004 | Martin |
| 6,710,514 B2 | 3/2004 | Ikada et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 8,278,802 B1 | 10/2012 | Lee et al. |
| 8,294,330 B1 | 10/2012 | Abbott et al. |
| 8,344,815 B2 | 1/2013 | Yamanaka |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,130,145 B2 | 9/2015 | Martin et al. |
| 9,219,466 B2 | 12/2015 | Meltaus et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,826,462 B2 | 11/2020 | Plesski et al. |
| 10,868,512 B2 | 12/2020 | Garcia et al. |
| 10,917,070 B2 | 2/2021 | Plesski et al. |
| 2002/0079986 A1 | 6/2002 | Ruby et al. |
| 2002/0158714 A1 | 10/2002 | Kaitila et al. |
| 2002/0189062 A1 | 12/2002 | Lin et al. |
| 2003/0080831 A1 | 5/2003 | Naumenko et al. |
| 2003/0199105 A1 | 10/2003 | Kub et al. |
| 2004/0100164 A1 | 5/2004 | Murata |
| 2004/0261250 A1 | 12/2004 | Kadota et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi |
| 2008/0252394 A1 | 10/2008 | Tajima et al. |
| 2009/0250250 A1 | 10/2009 | Ishii |
| 2010/0064492 A1 | 3/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto |
| 2011/0205199 A1 | 8/2011 | Hisakawa |
| 2011/0278993 A1 | 11/2011 | Iwamoto |
| 2012/0286900 A1 | 11/2012 | Kadota et al. |
| 2013/0234805 A1* | 9/2013 | Takahashi ............ H10N 30/87 29/25.35 |
| 2013/0271238 A1 | 10/2013 | Onda |
| 2013/0278609 A1 | 10/2013 | Stephanou et al. |
| 2013/0321100 A1 | 12/2013 | Wang |
| 2014/0130319 A1 | 5/2014 | Iwamoto |
| 2014/0145556 A1* | 5/2014 | Kadota ............ H03H 9/02228 310/313 A |
| 2014/0015214 A1 | 6/2014 | Kando et al. |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0042417 A1 | 2/2015 | Onodera et al. |
| 2015/0319537 A1 | 11/2015 | Perois et al. |
| 2015/0333730 A1 | 11/2015 | Meltaus |
| 2016/0028367 A1 | 1/2016 | Shealy |
| 2016/0007995 A9 | 3/2016 | Burak |
| 2016/0182009 A1 | 6/2016 | Bhattacharjee |
| 2016/0374193 A1 | 12/2016 | Namkung |
| 2017/0005217 A1 | 2/2017 | Branch et al. |
| 2017/0063332 A1 | 3/2017 | Gilbert et al. |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0035873 A1 | 12/2017 | Kishimoto et al. |
| 2017/0358730 A1* | 12/2017 | Kishimoto .......... H10N 30/871 |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2019/0068164 A1 | 2/2019 | Houlden et al. |
| 2019/0081613 A1* | 3/2019 | Nosaka ................... H03H 9/64 |
| 2019/0123721 A1 | 4/2019 | Takamine |
| 2019/0131953 A1* | 5/2019 | Gong ................ H03H 9/14555 |
| 2019/0027348 A1 | 9/2019 | Lin et al. |
| 2019/0273480 A1 | 9/2019 | Lin |
| 2019/0305751 A1* | 10/2019 | Mimura ................. H03H 9/145 |
| 2019/0348966 A1 | 11/2019 | Campanella-Pineda |
| 2020/0036357 A1 | 1/2020 | Mimura |
| 2020/0235719 A1 | 7/2020 | Yantchev et al. |

FOREIGN PATENT DOCUMENTS

| | | | |
|---|---|---|---|
| WO | 2018003273 A1 | 1/2018 | |
| WO | WO-2018116602 A1 * | 6/2018 | ......... H03H 9/02559 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM of 153", 2017 IEEE 30th International Conference

(56) References Cited

OTHER PUBLICATIONS in Micro Electro Mechanical Systems (MEMS). Jan. 22-26, 2017. pp. 942-945.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
G. Manohar, "Investigation of Various Surface Acoustic Wave Design Configurations for Improved Sensitivity." Doctoral dissertation, University of South Florida, USA, Jan. 2012, 7 pages.
Ekeom, D. & Dubus, Bertrand & Volatier, A.. (2006). Solidly mounted resonator (SMR) FEM-BEM simulation. 1474-1477. 10.1109/ULTSYM.2006.371.
Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.
Naumenko et al., "Optimal orientations of Lithium Niobate for resonator SAW filters", 2003 IEEE Ultrasonics Symposium—pp. 2110-2113. (Year: 2003).
Webster Dictionary Meaning of "diaphragm" Merriam Webster since 1828.
Buchanan "Ceramit Materials for Electronics" 3rd Edition, first published in 2004 by Marcel Dekker, Inc. pp. 496 (Year 2004). 00 Jan. 2004.
Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) 00 Jan. 2015.
Zou, Jie "High-Performance Aluminum Nitride Lamb Wave Resonators for RF Front-End Technology" University of California, Berkeley, Summer 2015, pp. 63 (Year 2015) 00 Jan. 2015.
Santosh, G., Surface acoustic wave devices on silicon using patterned and thin film ZnO, Ph.D. thesis, Feb. 2016, Indian Institute of technology Guwahati, Assam, India Feb. 2016.
Merriam Webster, dictionary meaning of the word "diaphragm", since 1828, Merriam Webster (Year: 1828) 1828.
Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.
USPTO/ISA, International Search Report and Written Opinion for PCT Application No. PCT/US2020/45654 dated Oct. 29, 2020. 2020.
Safari et al. "Piezoelectric for Transducer Applications" published by Elsevier Science Ltd., pp. 4 (Year: 2000). 2020.
Moussa et al. Review on Triggered Liposomal Drug Delivery with a Focus on Ultrasound 2015, Bentham Science Publishers, pp. 16 (Year 2005) 2005.
Acoustic Properties of Solids ONDA Corporation 592 Weddell Drive, Sunnyvale, CA 94089, Apr. 11, 2003, pp. 5 (Year 2003). 2003.
Bahreyni, B. Fabrication and Design of Resonant Microdevices Andrew William, Inc. 2018, NY (Year 2008). 2008.
Material Properties of Tibtech Innovations, © 2018 Tibtech Innovations (Year 2018). 2018.
Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.
Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.
A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

* cited by examiner

TRANSVERSELY-EXCITED FILM BULK ACOUSTIC RESONATORS WITH THREE-LAYER ELECTRODES

RELATED APPLICATION INFORMATION

This patent claims priority from provisional patent application 63/040,437, filed Jun. 17, 2020, entitled XBAR WITH THREE LAYER ELECTRODES, and provisional patent application 63/043,672, filed Jun. 24, 2020, entitled XBAR WITH MULTIPLE LAYER METAL ELECTRODES, which are both incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to bandpass filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
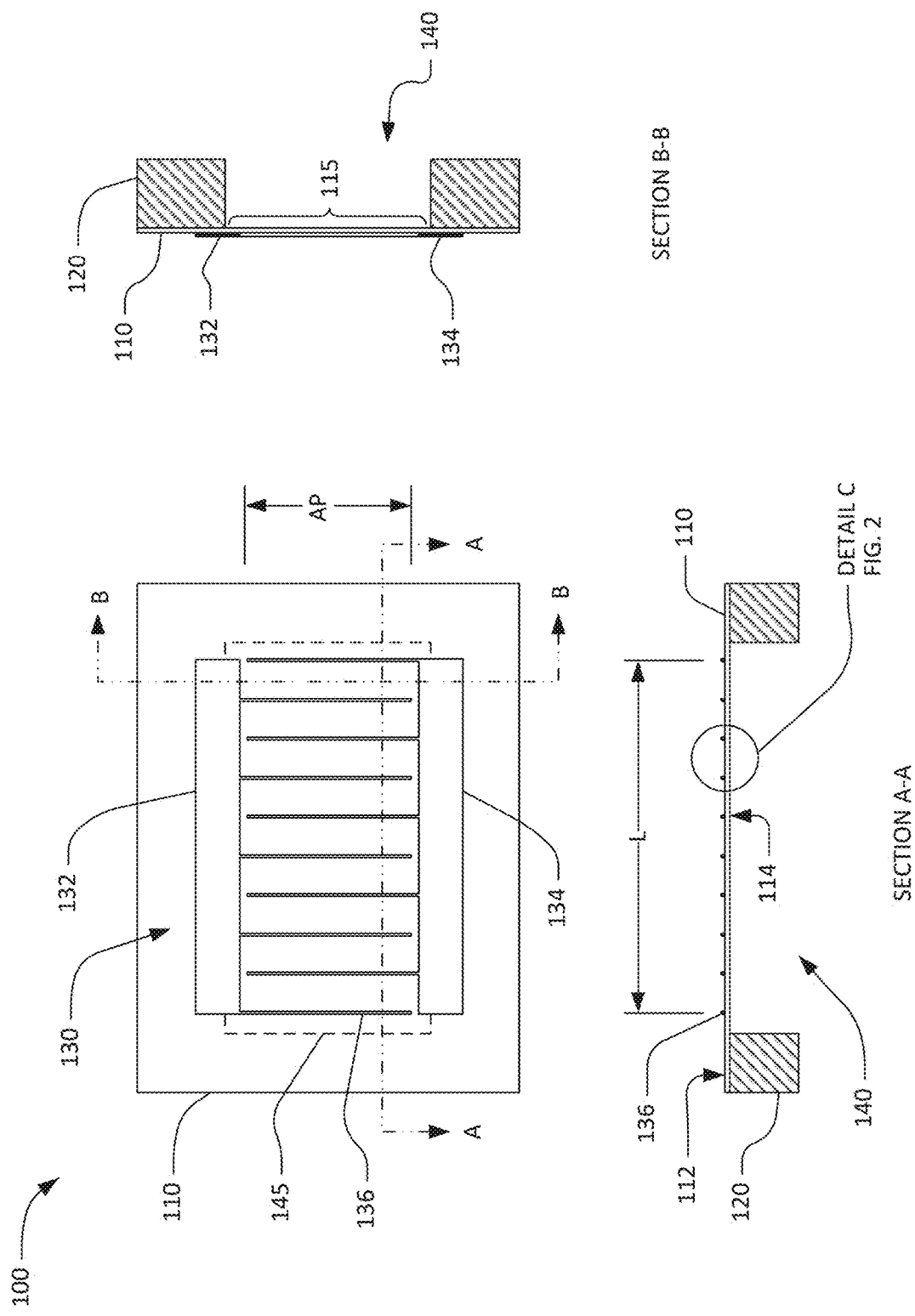
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front and back surfaces 112, 114. However, XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds of parallel fingers in the IDT 110. Similarly, the thickness of the fingers in the cross-sectional views is greatly exaggerated.

A front-side dielectric layer may optionally be formed on the front side of the piezoelectric plate 110. The "front side" of the XBAR is, by definition, the surface facing away from the substrate. The front-side dielectric layer may be formed only between the IDT fingers or may be deposited as a blanket layer such that the dielectric layer is formed both between and over the IDT fingers. The front-side dielectric layer may be a non-piezoelectric dielectric material, such as silicon dioxide or silicon nitride. The thickness of the front side dielectric layer is typically less than or equal to the thickness of the piezoelectric plate. The front-side dielectric layer may be formed of multiple layers of two or more materials.

Communications devices operating in time-domain duplex (TDD) bands transmit and receive in the same frequency band. Both the transmit and receive signal paths pass through a common bandpass filter connected between an antenna and a transceiver. Communications devices operating in frequency-domain duplex (FDD) bands transmit and receive in different frequency bands. The transmit and receive signal paths pass through separate transmit and receive bandpass filters connected between an antenna and the transceiver. Filters for use in TDD bands or filters for use as transmit filters in FDD bands can be subjected to radio frequency input power levels of 30 dBm or greater and must avoid damage under power.

The required insertion loss of acoustic wave bandpass filters is usually not more than a few dB. Some portion of this lost power is return loss reflected back to the power source; the rest of the lost power is dissipated in the filter. Typical band-pass filters for LTE bands have surface areas of 1.0 to 2.0 square millimeters. Although the total power dissipation in a filter may be small, the power density can be high given the small surface area. Further, the primary loss mechanisms in an acoustic filter are resistive losses in the conductor patterns and acoustic losses in the IDT fingers and piezoelectric material. Thus, the power dissipation in an acoustic filter is concentrated in the acoustic resonators. To prevent excessive temperature increase in the acoustic resonators, the heat due to the power dissipation must be conducted away from the resonators through the filter package to the environment external to the filter.

In traditional acoustic filters, such as surface acoustic wave (SAW) filters and bulk acoustic wave (BAW) filters, the heat generated by power dissipation in the acoustic resonators is efficiently conducted through the filter substrate and the metal electrode patterns to the package. In an XBAR device, the resonators are disposed on thin piezoelectric diaphragms that are inefficient heat conductors. The large majority of the heat generated in an XBAR device must be removed from the resonator via the IDT fingers and associated conductor patterns.

The electric resistance of the IDT fingers can be reduced, and the thermal conductivity of the IDT fingers can be increased, by increasing the cross-sectional area of the fingers to the extent possible. Unlike SAW or BAW, for XBAR there is little coupling of the primary acoustic mode to the IDT fingers. Changing the width and/or thickness of the IDT fingers has minimal effect on the primary acoustic mode in an XBAR device. This is a very uncommon situation for an acoustic wave resonator. However, the IDT finger geometry does have a substantial effect on coupling to spurious acoustic modes, such as higher order shear modes and plate modes that travel laterally in the piezoelectric diaphragm.

Figure 2:
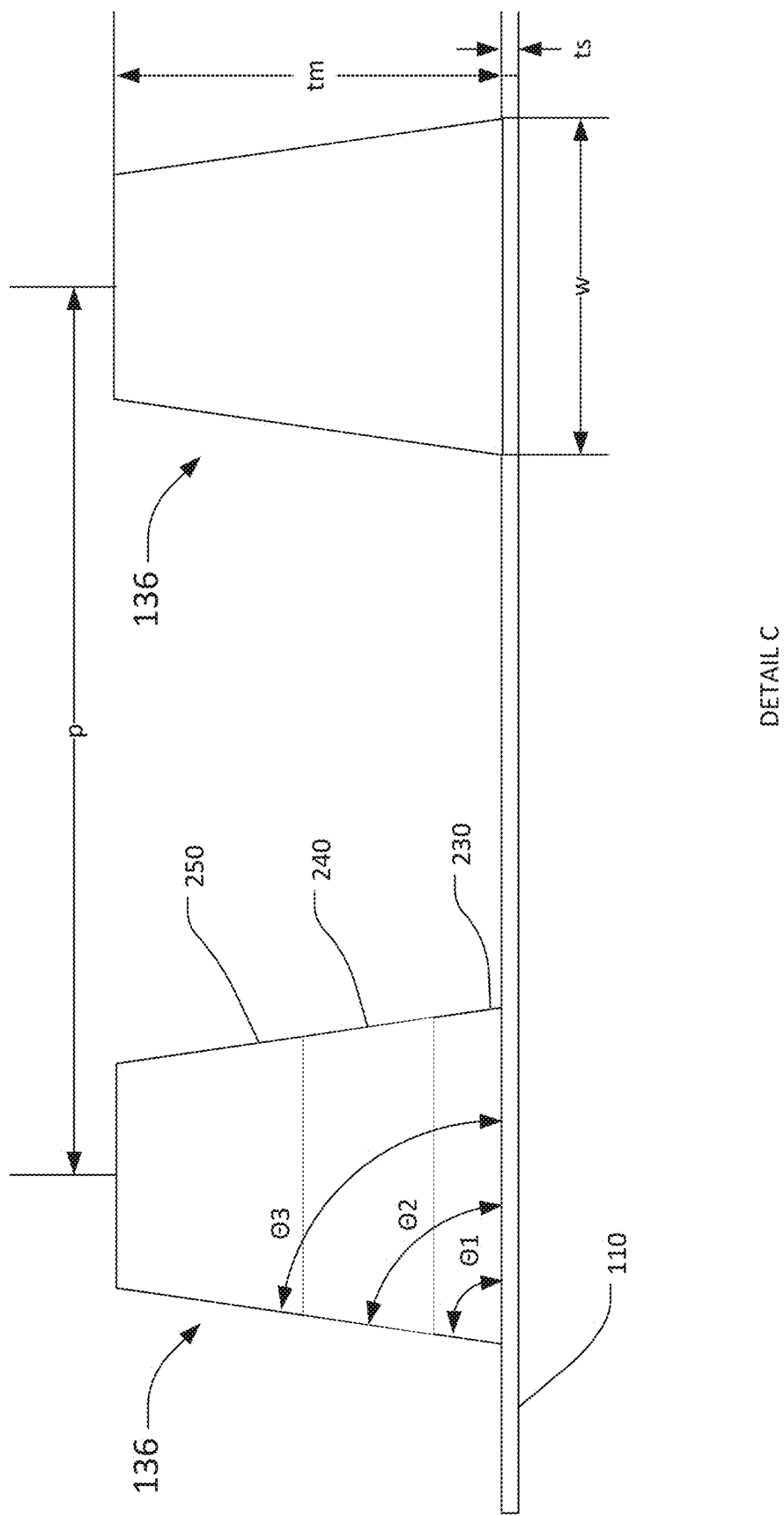
FIG. 2 is an expanded schematic cross-sectional view of a portion of the XBAR of FIG. 1.

FIG. 2 shows a detailed schematic cross-sectional view of the XBAR 100 at Detail C, including a three-layer IDT finger 136 with a trapezoidal cross-sectional shape that may reduce spurious modes.

Dimension p is the center-to-center spacing or "pitch" of the IDT fingers, which may be referred to as the pitch of the IDT and/or the pitch of the XBAR. Dimension w is the width or "mark" of the IDT fingers. In an XBAR, the pitch p of the IDT is typically 2 to 20 times the width w of the fingers. In addition, the pitch p of the IDT is typically 2 to 20 times a thickness is of the piezoelectric slab 212. The width of XBAR IDT fingers may be 500 nm or greater, such that the IDT can be readily fabricated using optical lithography. A thickness tm of the IDT fingers may be from 100 nm to about equal to the width w. The thickness of the busbars (132, 134 in FIG. 1) of the IDT may be the same as, or greater than, the thickness tm of the IDT fingers. The dimensions of an XBAR scale inversely with frequency. For example, the resonance frequency of an XBAR can be reduce by 20% by increasing all of the dimensions of an XBAR by 20%. Since the resonance frequency of an XBAR is primarily determined by the thickness of the piezoelectric plate, it is convenient to express others dimensions relative to the piezoelectric plate thickness.

The finger 136 has a lower first layer 230 proximate (e.g., very close to) a top surface of the diaphragm 110, which is substantially parallel to the bottom surface. The first layer 230 can be in contact with the diaphragm 110. Alternatively, a relatively thin layer (in comparison with the thickness of the first layer), such as an adhesion layer, can be between the first layer 230 and the diaphragm, which may facilitate coupling or bonding of the first layer 230 to the diaphragm 110. The first layer 230 has sidewalls extending at a sidewall angle θ1 to the diaphragm 110, where θ1 can be in a range from 70 degrees to 110 degrees. The cross-section is an inverted trapezoid when θ1 is greater than 90.

The finger 136 has a second layer 240 on the first layer 230 opposite the diaphragm 110. The second layer 240 also has sidewalls extending away from the diaphragm 210 at a sidewall angle θ2, where θ2 can be in a range from 70 degrees to 110 degrees.

The finger 136 has a third layer 250 on the second layer 240 opposite the diaphragm 110. The third layer 250 also has sidewalls extending away from the diaphragm 110 at a sidewall angle θ3, where θ3 can be in a range from 70 degrees to 110 degrees.

θ1, θ2, and θ3 may be the same or different. The cross-sectional width of the first layer 230 can be greater or less than the cross-sectional width of the second layer 240, and the cross-sectional width of the second layer 240 can be greater or less than the cross-sectional width of the third layer 250.

The cross-sectional thicknesses of the first layer 230, second layer 240, and third layer 250 can be the same or different from each other. For example, the cross-sectional thickness of first layer 230 can be less than the cross-sectional thickness of the second layer 240 and the third layer 250. The thickness of each of the three metal layers can be less than one-half of the acoustic wavelength and preferably about one-quarter of the acoustic wavelength. Precise control of the thickness is not required so long as the acoustic reflections from the interfaces between the layers tend to cancel rather than add. In another example, each of cross-sectional thicknesses of the first layer 230, second layer 240, and third layer 250 can be in a range from 25% to 75% of the thickness of the diaphragm.

The first layer 230, second layer 240, and third layer 250 are formed of different materials. The first layer 230 may be a metal with low transverse acoustic impedance. The second layer 240 may be a material having high transverse acoustic impedance such that the acoustic waves are confined below the second layer 240. The third layer 240 may be a material with a low transverse acoustic impedance and higher electrical conductivity. Aluminum (Al) and titanium (Ti) have low transverse acoustic impedance and are suitable for use in the first or third layer. Chromium and tungsten have high transverse acoustic impedance and are suitable for the second layer. Copper, molybdenum, gold, or platinum have intermediate transverse acoustic impedance and are suitable for the third layer. Copper, aluminum, and gold also have high thermal and electrical conductivity and are particularly suited for the third layer.

Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling.

As will be further discussed below, simulations of XBAR devices with combinations of metal layers including Al/Cr/Al, Al/W/Al, and Al/W/Cu indicate the three-layer electrode structure provides reduced spurious modes and improved anti-resonance Q compared to similar devices with single-layer electrodes having about the same thickness.

Figure 3:
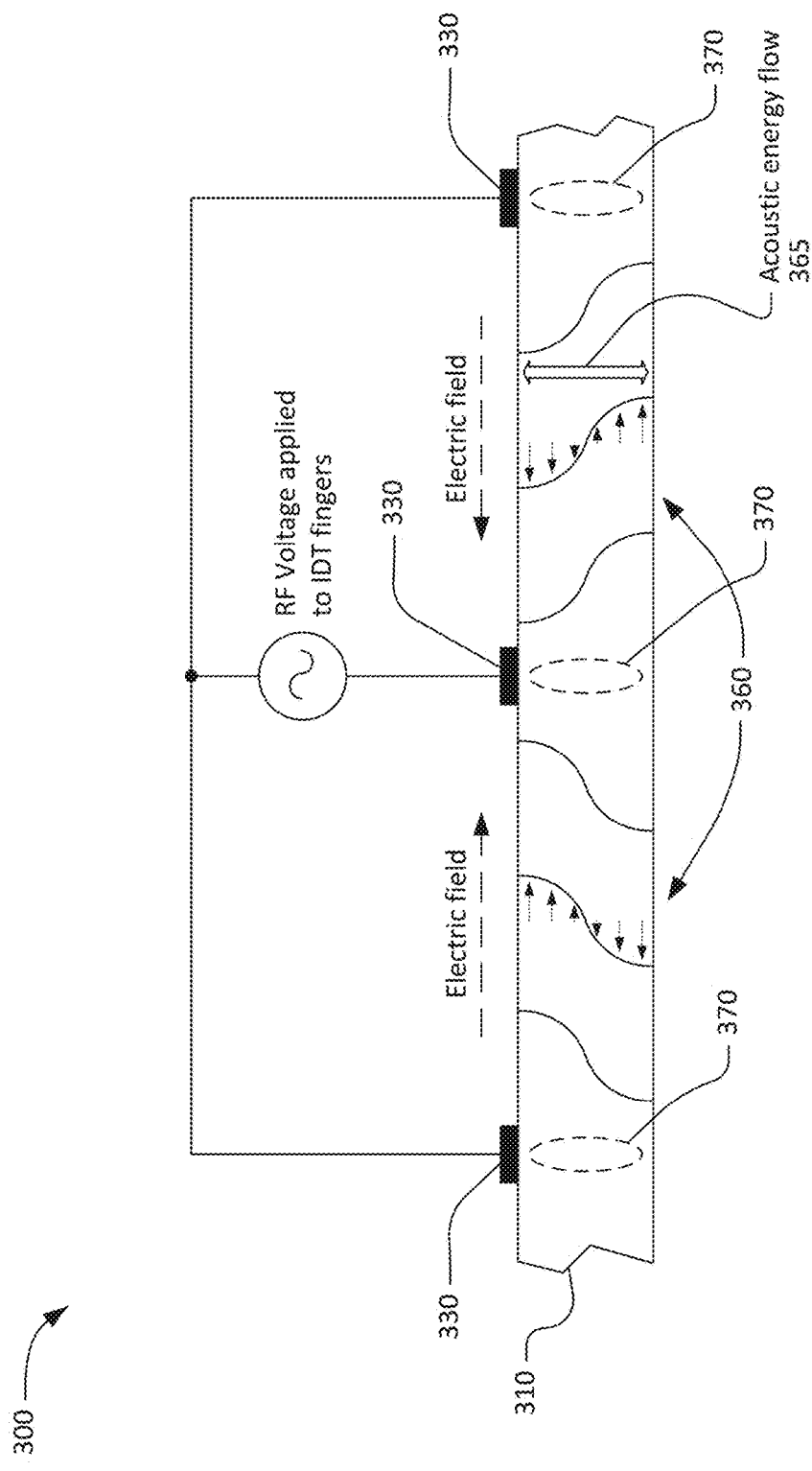
FIG. 3 is a graphic illustrating a primary acoustic mode in an XBAR.

FIG. 3 is a graphical illustration of the primary acoustic mode of interest in an XBAR. FIG. 3 shows a small portion of an XBAR 300 including a piezoelectric plate 310 and three interleaved IDT fingers 330 which alternate in electrical polarity from finger to finger. An RF voltage is applied to the interleaved fingers 330. This voltage creates a time-varying electric field between the fingers. The direction of the electric field is predominantly lateral, or parallel to the surface of the piezoelectric plate 310, as indicated by the arrows labeled "electric field". Due to the high dielectric constant of the piezoelectric plate, the RF electric energy is highly concentrated inside the plate relative to the air. The lateral electric field introduces shear deformation which couples strongly to a shear primary acoustic mode (at a resonance frequency defined by the acoustic cavity formed by the volume between the two surfaces of the piezoelectric plate) in the piezoelectric plate 310. In this context, "shear deformation" is defined as deformation in which parallel planes in a material remain predominantly parallel and maintain constant separation while translating (within their respective planes) relative to each other. A "shear acoustic mode" is defined as an acoustic vibration mode in a medium that results in shear deformation of the medium. The shear deformations in the XBAR 300 are represented by the curves 360, with the adjacent small arrows providing a schematic indication of the direction and relative magnitude of atomic motion at the resonance frequency. The degree of atomic motion, as well as the thickness of the piezoelectric plate 310, have been greatly exaggerated for ease of visualization. While the atomic motions are predominantly lateral (i.e. horizontal as shown in FIG. 3), the direction of acoustic energy flow of the excited primary acoustic mode is substantially orthogonal to the surface of the piezoelectric plate, as indicated by the arrow 365.

Considering FIG. 3, there is essentially no RF electric field immediately under the IDT fingers 330, and thus acoustic modes are only minimally excited in the regions 370 under the fingers. There may be evanescent acoustic motions in these regions. Since acoustic vibrations are not excited under the IDT fingers 330, the acoustic energy coupled to the IDT fingers 330 is low (for example compared to the fingers of an IDT in a SAW resonator) for the primary acoustic mode, which minimizes viscous losses in the IDT fingers.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. Such devices are usually based on AlN thin films with the C axis of the AlN perpendicular to the surfaces of the film. The acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 4:
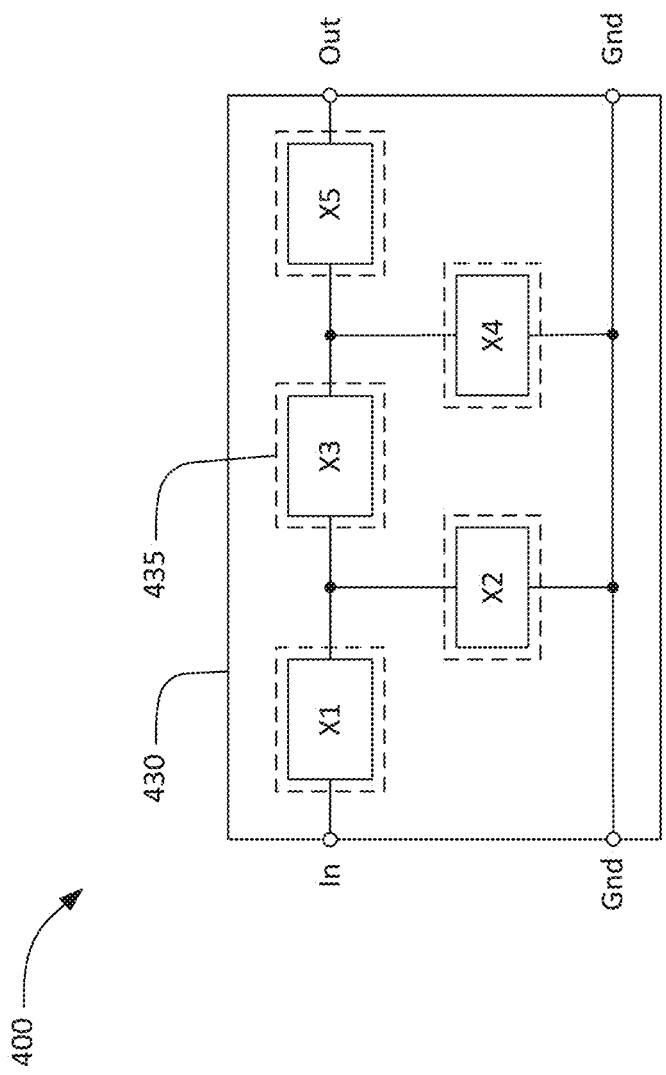
FIG. 4 is a schematic circuit diagram of a band-pass filter using acoustic resonators in a ladder circuit.

FIG. 4 is a schematic circuit diagram of a band-pass filter 400 using five XBARs X1-X5. The filter 400 may be, for example, a band n79 band-pass filter for use in a communication device. The filter 400 has a conventional ladder filter architecture including three series resonators X1, X3, X5 and two shunt resonators X2, X4. The three series resonators X1, X3, X5 are connected in series between a first port and a second port. In FIG. 4, the first and second ports are labeled "In" and "Out", respectively. However, the filter 400 is bidirectional and either port may serve as the input or output of the filter. The two shunt resonators X2, X4 are connected from nodes between the series resonators to ground. All the shunt resonators and series resonators are XBARs.

The three series resonators X1, X3, X5 and the two shunt resonators X2, X4 of the filter 400 maybe formed on a single plate 430 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 4, the cavities are illustrated schematically as the dashed rectangles (such as the rectangle 435). In this example, an IDT of each resonator is disposed over a respective cavity. In other filters, the IDTs of two or more resonators may be disposed over a common cavity. Resonators may also be cascaded into multiple IDTs which may be formed on multiple cavities.

Each of the resonators X1 to X5 has a resonance frequency and an anti-resonance frequency. In simplified terms, each resonator is effectively a short circuit at its resonance frequency and effectively an open circuit at its anti-resonance frequency. Each resonator X1 to X5 creates a "transmission zero", where the transmission between the in and out ports of the filter is very low. Note that the transmission at a "transmission zero" is not actually zero due to energy leakage through parasitic components and other effects. The three series resonators X1, X3, X5 create transmission zeros at their respective anti-resonance frequencies (where each resonator is effectively an open circuit). The two shunt resonators X2, X4 create transmission zeros at their respective resonance frequencies (where each resonator is effectively a short circuit). In a typical band-pass filter using acoustic resonators, the anti-resonance frequencies of the series resonators create transmission zeros above the passband, and the resonance frequencies of the shunt resonators create transmission zeros below the passband.

Figure 5:
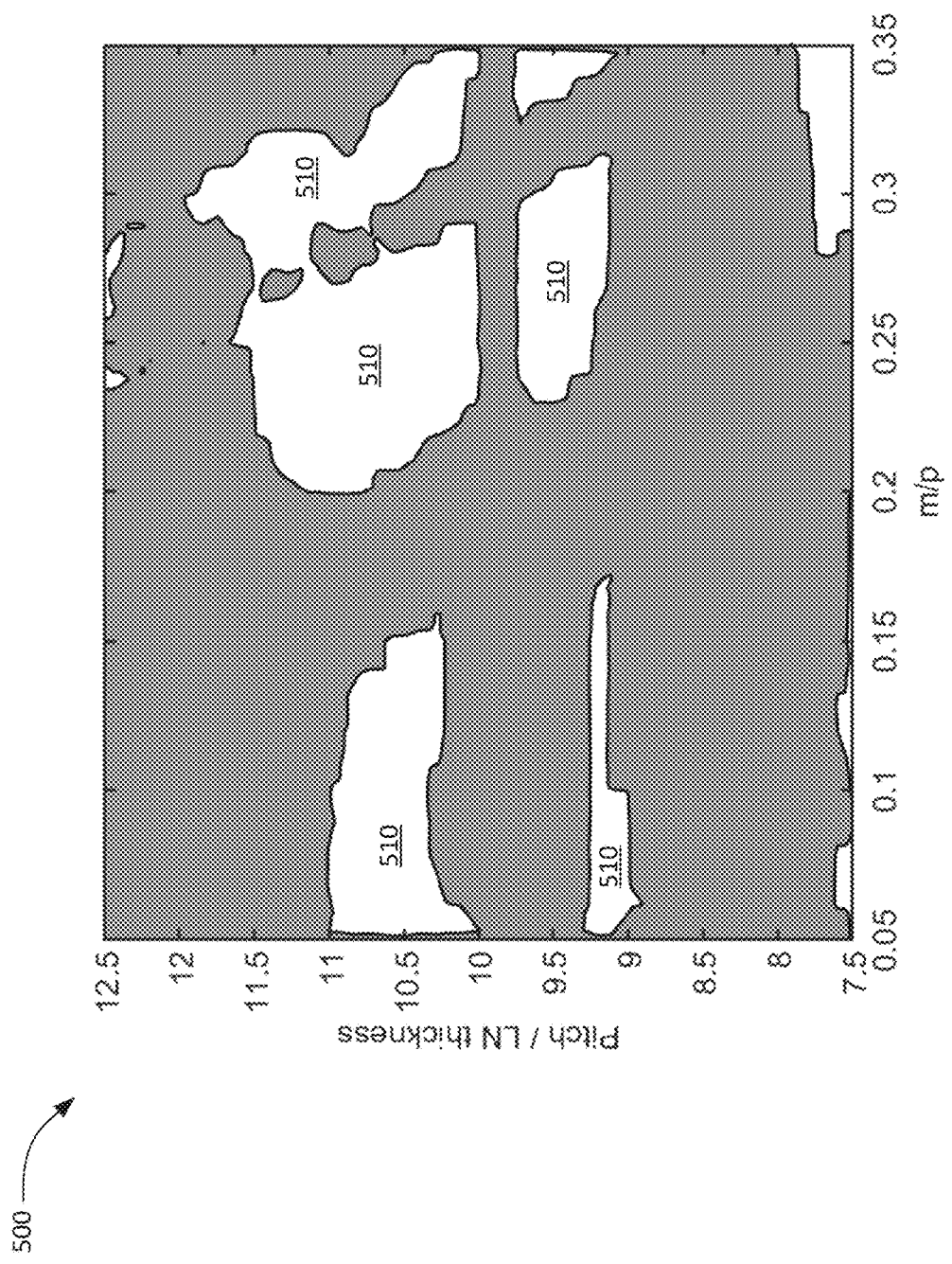
FIG. 5 is a FOM diagram for an XBAR with a single-layer IDT.

FIG. 5 is a figure of merit (FOM) diagram 500 for simulated XBARs with a single layer IDT. Given the complex dependence of spurious mode frequency and amplitude on diaphragm thickness ts, IDT layer thicknesses tm, IDT pitch p and IDT finger width w, the inventors undertook an empirical evaluation, using two-dimensional finite element modeling, of a large number of hypothetical XBAR resonators. Diagram 500 includes each combination of pitch/diaphragm thickness (LN thickness) ts and mark/pitch (m/p) for a particular IDT finger material, thickness, and sidewall angle. The FOM is calculated by integrating the negative impact of spurious modes across a defined frequency range. The FOM and the frequency range depend on the requirements of a particular filter. The frequency range typically includes the passband of the filter and may include one or more stop bands. Spurious modes occurring between the resonance and anti-resonance frequencies of each hypothetical resonator were given a heavier weight in the FOM than spurious modes at frequencies below resonance or above anti-resonance. Hypothetical resonators having a FOM value below a threshold value were considered potentially "useable", which is to say probably having sufficiently low spurious modes for use in a filter. In this example, the finger is formed of 500 nm thick aluminum, where LN plate thickness is 410 nm and sidewall angle is 80 degrees. Hypothetical resonators having a FOM value above the threshold value (shaded areas of diagram were considered not useable. Regions 510 (unshaded) indicate parameters that are likely to produce resonators with acceptable performance characteristics.

Figure 6:
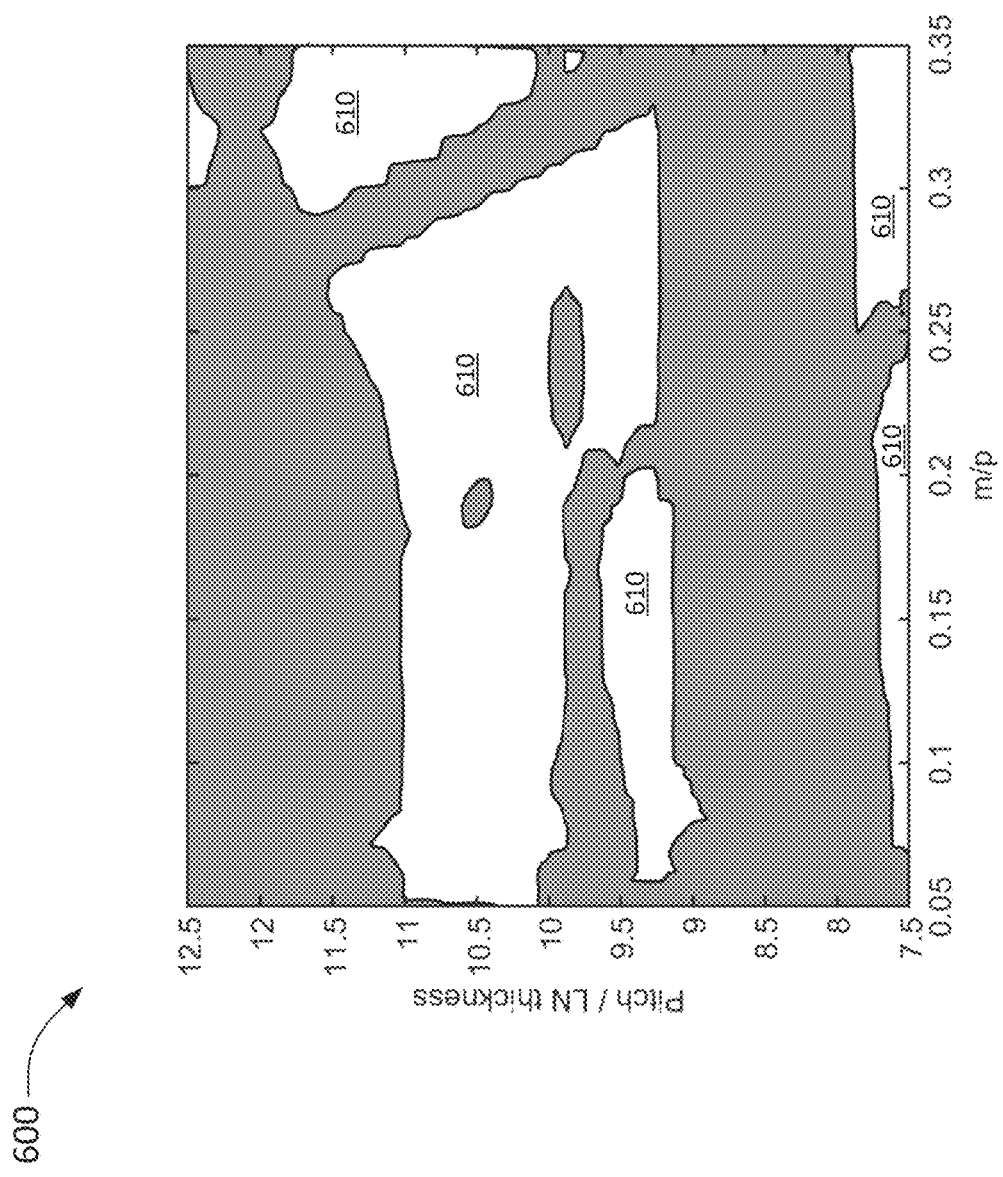
FIG. 6 is a FOM diagram for an XBAR with a three-layer IDT.

FIG. 6 is a FOM diagram 600 for an XBAR with a three-layer IDT finger, where the first layer is 150 nm thick aluminum, the second layer is 250 nm chromium, and the third layer is 150 nm thick aluminum. LN plate thickness is 410 nm, and sidewall angle is 80 degrees. Regions 610 (unshaded) indicate parameters that are likely to produce resonators with acceptable performance characteristics. The FOM of FIG. 6 indicates that three-layer fingers are less sensitive to variations in mark and sidewall angle than single-layer fingers with roughly the same thermal and electrical conductivity. Three-layer fingers provide a larger pitch/mark design space than single-layer fingers with and without an oxide overlayer.

Three-layer fingers with a low acoustic impedance underlayer, a thicker high acoustic impedance center layer, and a low acoustic impedance upper layer are effective at reducing spurious modes and may provide higher thermal and electrical conductivity than a single-layer fingers. Using three metal layers can move/suppress spurious modes and provide higher electrical and thermal conductivity. Three-layer fingers can provide better electrical and thermal conductivity than single-layer fingers.

Description of Methods

Figure 7:
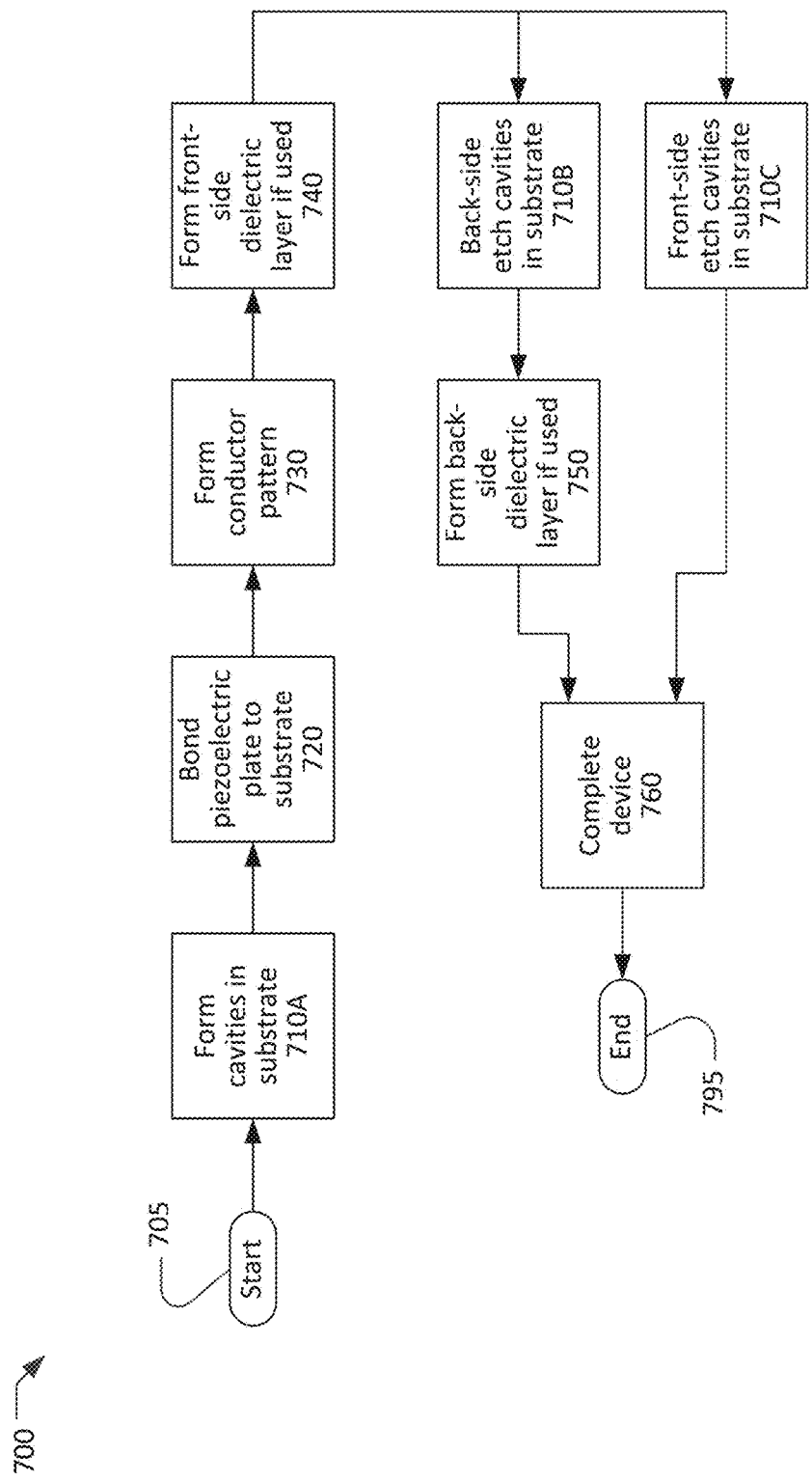
FIG. 7 is a flow chart of a process for fabricating an XBAR or a filter including XBARs.

FIG. 7 is a simplified flow chart showing a process 700 for making an XBAR or a filter incorporating XBARs. The process 700 starts at 705 with a substrate and a plate of piezoelectric material and ends at 795 with a completed XBAR or filter. The flow chart of FIG. 7 includes only major process steps. Various conventional process steps (e.g. surface preparation, cleaning, inspection, baking, annealing, monitoring, testing, etc.) may be performed before, between, after, and during the steps shown in FIG. 7.

The flow chart of FIG. 7 captures three variations of the process 700 for making an XBAR which differ in when and how cavities are formed in the substrate. The cavities may be formed at steps 710A, 710B, or 710C. Only one of these steps is performed in each of the three variations of the process 700.

The piezoelectric plate may be, for example, lithium niobate or lithium tantalate, and may be Z-cut, rotated Z-cut, rotated YX-cut, or some other cut. The substrate may preferably be silicon. The substrate may be some other material that allows formation of deep cavities by etching or other processing.

In one variation of the process 700, one or more cavities are formed in the substrate at 710A, before the piezoelectric plate is bonded to the substrate at 720. A separate cavity may be formed for each resonator in a filter device. The one or more cavities may be formed using conventional photolithographic and etching techniques. Typically, the cavities formed at 710A will not penetrate through the substrate.

At 720, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including three-layer IDT fingers of each XBAR, is formed at 730 by depositing and patterning conductor layers on the front side of the piezoelectric plate. The first conductor layer may be, for example, aluminum (Al) and titanium (Ti), which have low transverse acoustic impedance. The second conductor layer may be, for example, chromium and tungsten, which have high transverse acoustic impedance. The third layer can be, for example, copper, molybdenum, gold, or platinum, which have intermediate transverse acoustic impedance. Copper, aluminum, and gold also have high thermal and electrical conductivity and are suited for the third layer. Optionally, one or more layers of other materials may be disposed below (i.e. between the conductor layer and the piezoelectric plate), between layers of the conduction layer, and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 730 by depositing one or more of the three conductor layers and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, one or more of the three conductor layers may be formed at 730 using a lift-off process. Photoresist may be deposited over the piezoelectric plate. and patterned to define the conductor pattern. The three conductor layers and, optionally, one or more other layers may be deposited in sequence over the surface of the piezoelectric plate. The photoresist may then be removed, which removes the excess material, leaving the conductor pattern.

The three conductor layers may be deposited and patterned separately. In particular, different patterning processes (i.e. etching or lift-off) may be used on different layers and different masks are required where two or more layers have different widths or shapes.

At 740, a front-side dielectric layer may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

In a second variation of the process 700, one or more cavities are formed in the back side of the substrate at 710B. A separate cavity may be formed for each resonator in a filter device. The one or more cavities may be formed using an anisotropic or orientation-dependent dry or wet etch to open holes through the back side of the substrate to the piezoelectric plate. In this case, the resulting resonator devices will have a cross-section as shown in FIG. 1.

In the second variation of the process 700, a back-side dielectric layer may be formed at 750. In the case where the cavities are formed at 710B as holes through the substrate, the back-side dielectric layer may be deposited through the cavities using a conventional deposition technique such as sputtering, evaporation, or chemical vapor deposition.

In a third variation of the process 700, one or more cavities in the form of recesses in the substrate may be formed at 710C by etching the substrate using an etchant introduced through openings in the piezoelectric plate. A separate cavity may be formed for each resonator in a filter device.

In all variations of the process 700, the filter device is completed at 760. Actions that may occur at 760 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 760 is to tune the resonant frequencies of the resonators within the device by adding or removing metal or dielectric material from the front side of the device. After the filter device is completed, the process ends at 795.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

The invention claimed is:

1. An acoustic resonator device comprising:
a substrate having a surface;
a piezoelectric layer attached to the surface of the substrate either directly or via one or more intermediate layers, the piezoelectric layer having a portion that forms a diaphragm that is over a cavity of the acoustic resonator device; and
an interdigital transducer (IDT) on a surface of the piezoelectric layer and having interleaved fingers on the diaphragm, the IDT configured such that a radio frequency signal applied to the IDT excites a primary shear acoustic mode in the diaphragm,
wherein the interleaved fingers comprise a first layer proximate the diaphragm, a second layer over the first layer, and a third layer over the second layer such that the second layer is between the first and third layers, wherein adjacent layers are comprised of different metals and a thickness of the second layer is in a range from 25% to 75% of a thickness of the diaphragm, and
wherein the primary shear acoustic mode is a bulk shear mode where acoustic energy propagates in a direction predominantly orthogonal to the surface of the piezoelectric layer and transverse to a direction of an electric field created by the interleaved fingers of the IDT that is predominantly lateral to the surface of the piezoelectric layer.

2. The device of claim 1, wherein the first layer comprises a low transverse acoustic impedance metal, wherein the second layer comprises a high transverse acoustic impedance metal, wherein the third layer comprises an intermediate transverse acoustic impedance metal.

3. The device of claim 1, wherein a thickness of the first layer is in a range from 25% to 75% of thickness of the diaphragm.

4. The device of claim 1, wherein a thickness of the third layer is in a range from 25% to 75% of a thickness of the diaphragm.

5. The device of claim 1, wherein the first layer comprises aluminum or titanium.

6. The device of claim 1, wherein the second layer comprises chromium or tungsten.

7. The device of claim 1, wherein the third layer comprises aluminum, titanium, copper, molybdenum, gold, or platinum.

8. The device of claim 1, further comprising an adhesion layer between the first layer and the diaphragm.

9. The device of claim 1, wherein the diaphragm is contiguous with the piezoelectric layer around at least 50% of a perimeter of the cavity.

10. A filter device comprising:
a plurality of acoustic resonators that each comprise:
a substrate having a surface;
a piezoelectric layer attached to the surface of the substrate either directly or via one or more intermediate layers, the piezoelectric layer having a portion that forms a diaphragm over a cavity of the respective acoustic resonator; and
a conductor pattern on a surface of the piezoelectric layer, the conductor pattern including an interdigital transducer (IDT) having interleaved fingers that are disposed on the respective diaphragm, the piezoelectric layer and the IDT configured such that a radio frequency signal applied to the IDT excites a primary shear acoustic mode in the respective diaphragm,
wherein the interleaved fingers of the IDT of each of the plurality of acoustic resonators comprise a first layer proximate the respective diaphragm, a second layer over the first layer, and a third layer over the second layer such that the second layer is between the first and third layers, wherein adjacent layers are comprised of different metals, wherein the primary shear acoustic mode is a bulk acoustic wave having an electric field that is predominantly lateral in the piezoelectric layer, wherein the bulk acoustic wave propagates in a direction orthogonal to the piezoelectric layer and predominantly orthogonal to a surface of the piezoelectric layer, and wherein, for each of the plurality of acoustic resonators, a thickness of the first layer is in a range from 25% to 75% of a thickness of the respective diaphragm.

11. The device of claim 10, wherein, for each of the plurality of acoustic resonators, the first layer comprises a low transverse acoustic impedance metal, the second layer comprises a high transverse acoustic impedance metal, and the third layer comprises an intermediate transverse acoustic impedance metal.

12. The device of claim 10, wherein, for each of the plurality of acoustic resonators, a thickness of the second layer is in a range from 25% to 75% of a thickness of the respective diaphragm.

13. The device of claim 10, wherein, for each of the plurality of acoustic resonators, a thickness of the third layer is in a range from 25% to 75% of a thickness of the respective diaphragm.

14. The device of claim 10, wherein, for each of the plurality of acoustic resonators, the first layer comprises aluminum or titanium.

15. The device of claim 10, wherein, for each of the plurality of acoustic resonators, the second layer comprises chromium or tungsten.

16. The device of claim 10, wherein, for each of the plurality of acoustic resonators, the third layer comprises aluminum, titanium, copper, molybdenum, gold, or platinum.

17. The device of claim 10, wherein each of the plurality of acoustic resonators further comprises an adhesion layer between the first layer and the respective diaphragm.

18. The device of claim 10, wherein, for each of the plurality of acoustic resonators, the respective diaphragm is contiguous with the piezoelectric layer around at least 50% of a perimeter of the cavity.

19. The device of claim 1, wherein at least a portion of the interleaved fingers of the IDT have a mark that is greater than 0.05 times and less than 0.5 times a pitch of the interleaved fingers, wherein the mark is a width of each of the interleaved fingers and the pitch is a center-to-center spacing between adjacent fingers of the interleaved fingers.

20. The device of claim 10, wherein, for each of the plurality of acoustic resonators, at least a portion of the interleaved fingers of the IDT have a mark that is greater than 0.05 times and less than 0.5 times a pitch of the interleaved fingers, wherein the mark is a width of each of the interleaved fingers and the pitch is a center-to-center spacing between adjacent fingers of the interleaved fingers.

21. A filter device comprising:
a plurality of acoustic resonators that each comprise:
a substrate having a surface;
a piezoelectric layer attached to the surface of the substrate either directly or via one or more intermediate layers, the piezoelectric layer including a diaphragm over a cavity of the acoustic resonator; and
a conductor pattern on a surface of the piezoelectric layer, the conductor pattern including an interdigital transducer (IDT) having interleaved fingers that are disposed on the respective diaphragm, the piezoelectric layer and the IDT configured such that a radio frequency signal applied to the IDT excites a primary shear acoustic mode in the respective diaphragm,
wherein the interleaved fingers of the IDT of each of the plurality of acoustic resonators comprise a first layer proximate the respective diaphragm, a second layer over the first layer, and a third layer over the second layer such that the second layer is between the first and third layers, wherein adjacent layers are comprised of different metals,
wherein, for each of the plurality of acoustic resonators, a thickness of the first layer is in a range from 25% to 75% of a thickness of the respective diaphragm, and
wherein, for each of the plurality of acoustic resonators, the first layer comprises a low transverse acoustic impedance metal, the second layer comprises a high transverse acoustic impedance metal, and the third layer comprises an intermediate transverse acoustic impedance metal.

22. The filter device of claim 21, wherein the primary shear acoustic mode is a bulk acoustic wave that propagates in a direction predominantly orthogonal to the respective surface of each of the piezoelectric layers and transverse to a direction of an electric field created by the interleaved fingers of the respective IDT.

23. The filter device of claim 21, wherein, for each of the plurality of acoustic resonators, a thickness of the second layer is in a range from 25% to 75% of a thickness of the respective diaphragm.

24. The filter device of claim 21, wherein, for each of the plurality of acoustic resonators, a thickness of the third layer is in a range from 25% to 75% of a thickness of the respective diaphragm.

25. The filter device of claim 21, wherein, for each of the plurality of acoustic resonators, the first layer comprises aluminum or titanium.

26. The device of claim 21, wherein, for each of the plurality of acoustic resonators, the second layer comprises chromium or tungsten, and the third layer comprises aluminum, titanium, copper, molybdenum, gold, or platinum.

27. The device of claim 21, wherein each of the plurality of acoustic resonators further comprises an adhesion layer between the first layer and the respective diaphragm.

28. The device of claim 21, wherein, for each of the plurality of acoustic resonators, the respective diaphragm is contiguous with the piezoelectric layer around at least 50% of a perimeter of the cavity.

* * * * *